United States Patent [19]

Kusunoki

[11] Patent Number: 5,336,904
[45] Date of Patent: Aug. 9, 1994

[54] FIELD EFFECT ELEMENT UTILIZING RESONANT-TUNNELING AND A METHOD OF MANUFACTURING THE SAME

[75] Inventor: Shigeru Kusunoki, Hyogo, Japan

[73] Assignee: Mitsubishi Denki Kabushiki Kaisha, Tokyo, Japan

[21] Appl. No.: 864,897

[22] Filed: Apr. 2, 1992

[30] Foreign Application Priority Data

May 10, 1991 [JP] Japan .................................. 3-105878

[51] Int. Cl.⁵ ............................................ H01L 27/12
[52] U.S. Cl. ....................................... 257/23; 257/24; 257/25; 257/192; 257/51
[58] Field of Search ..................... 257/24, 25, 23, 51, 257/192, 289, 20

[56] References Cited

U.S. PATENT DOCUMENTS

| | | | |
|---|---|---|---|
| 4,127,861 | 11/1978 | Deneuville . | |
| 4,704,622 | 11/1987 | Capasso et al. | 257/25 |
| 4,721,983 | 1/1988 | Frazier | 257/25 |
| 4,873,558 | 10/1989 | Antreasyan et al. | 257/289 |
| 4,908,678 | 3/1990 | Yamazaki | 275/20 |
| 5,130,766 | 7/1992 | Arimoto et al. | 257/24 |
| 5,198,879 | 3/1993 | Ohshima | 257/24 |

OTHER PUBLICATIONS

"Applications of the Silicon Wafer Direct-Bonding Technique to Electron Devices", K. Furukawa et al., Applied Surface Science 41/42 (1989), pp. 627–632.

"Observation of Electron Resonant Tunneling in a Lateral Dual-Gate Resonant Tunneling Field-Effect Transistor", S. Y. Chou et al., Appl. Phys. Lett. 55 (2), Jul. 10, 1989, pp. 176–178.

"Surface Superlattice Formation in Silicon Inversion Layers Using 0.2[2m Period Grating-Gate Electrodes", A. C. Warren et al., 1985 IEEE Electron Device Letters, vol. EDL-6, No. 6, Jun. 1985, pp. 294–296.

"Lateral resonant tunneling in a double-barrier field-effect transistor", K. Ismail et al., Applied Physics Letters, vol. 55, No. 6, Aug. 7, 1989.

"Surface-superlattice effects in a grating-gate GaAs/GaAlAs modulation doped field-effect transistor", K. Ismail et al., Applied Physics Letters, vol. 52, No. 13, Mar. 28, 1988.

Primary Examiner—Sara W. Crane
Assistant Examiner—Courtney A. Bowers
Attorney, Agent, or Firm—Lowe, Price, LeBlanc & Becker

[57] ABSTRACT

A field effect transistor according to the present invention uses a silicon monocrystalline substrate. At least two independent thin amorphous silicon layers are formed in a position for preventing movement of majority carriers in a channel region in the surface of the silicon substrate. Each amorphous silicon layer is between monocrystalline silicon layers. A gate electrode is formed on the surface of the channel region through a gate insulating layer. Thin potential barriers and a potential well are formed in the channel region by at least two amorphous silicon layers. Sharp potential barriers are formed by forming thin amorphous silicon layers, and a field effect transistor utilizing the resonant-tunneling effect with high tunneling efficiency is implemented.

7 Claims, 17 Drawing Sheets

FIELD EFFECT ELEMENT UTILIZING RESONANT-TUNNELING AND A METHOD OF MANUFACTURING THE SAME

BACKGROUND OF THE INVENTION

Field of the Invention

The present invention relates to a structure of a field effect transistor utilizing a quantum resonant-tunneling effect using hetrojunction and a method of manufacturing the same.

Description of the Background Art

As accuracy of processing is enhanced in the field of semiconductor devices recently, the study of elements utilizing a quantum effect is activated. Among such elements, particularly, a field effect transistor utilizing a resonant-tunneling effect is developed. Three examples of a conventional field effect transistor utilizing the resonant-tunneling effect will be described in the following.

FIG. 28 is a cross sectional view showing a cross sectional structure of a field effect transistor according to a first conventional example. The shown field effect transistor is disclosed, for example, in "Lateral resonant tunneling in a double-barrier field-effect transistor" K. Ismail et al. *Applied Physics Letters* Vol. 55, No. 6, Aug. 7, 1989, pages 589–591, and in "Observation of Electron Resonant Tunneling in a lateral Dual-Gate Resonant Tunneling field-Effect Transistor", S.Y. Chou et al., *Applied Physics Letters* Vol. 55, No. 2, p 176–178. As illustrated in FIG. 28, a field effect transistor 40 has a GaAs layer 47, a superlattice layer 42, and a AlGaAs layer 43 (Al indicates aluminum.) layered on the surface of a semi-insulating GaAs substrate 41. Superlattice layer 42 is formed by the AlGaAs layer and the GaAs layer repeatedly growing. AlGaAs layer 43 is formed doped with silicon and having a thickness of 45 nm. GaAs layers 44, 44 doped with silicon and having a thickness of 50 nm are formed on both sides on the surface of AlGaAs layer 43. Source/drain regions 46, 46 are also formed on both sides of them. Two gate electrodes 45, 45 formed of Ti/Au are arranged on the surface of AlGaAs layer 43.

Now, description will be given of an operation utilizing the resonant-tunneling effect of field effect transistor 40 illustrated in FIG. 28. FIG. 29 is a diagram illustrating the potential of a conduction band along a path of electrons in the case where no voltage is applied between source/drain 46, 46. If two gate electrodes 45, 45 are arranged close to each other, and a predetermined gate voltage is applied thereto, two potential barriers corresponding to the gate electrodes and a potential well in the region between the potential barriers are formed. A plurality of energy levels discrete at certain levels are generated inside the potential well. If a predetermined potential is applied between the source/drain, only electrons having energy of the same levels as the energy levels existing in the potential well pass the potential barriers by a tunneling effect. Such a phenomenon is referred to as a resonant-tunneling effect. FIG. 30 is a graph showing a voltage-current characteristic of the field effect transistor 40 illustrated in FIG. 28. In FIG. 30, the gate voltage $V_{gs}$ is indicated on the abscissa, and the source/drain current $I_{DS}$ is indicated on the ordinate. The voltage $V_{DS}$ between the source/drain is 0.2 mV, and the temperature in the operating state is 4.2 K. As shown in FIG. 30, the source/drain current $I_{DS}$ has a negative resistance characteristic in which there are regions where the source/drain current $I_{DS}$ increases as the gate voltage increases and regions where the source/drain current $I_{DS}$ reduces as the gate voltage increases, appearing alternately and periodically. Tunnel current caused by the resonant-tunneling effect corresponding to the discrete energy levels in the potential well is generated in three peak regions shown in FIG. 30. The resonant-tunneling effect is influenced by the width of the potential barriers and the space between the adjacent potential barriers. If the width of the potential barriers is too large, the probability that the tunneling effect is caused is reduced. If the space between the potential barriers is too large, the difference of the levels of the energy levels formed in the potential well becomes small, and it becomes hard for an negative region to appear. For this reason, the width of gate electrode 45 and the distance between two gate electrodes 45, 45 are important in field effect transistor 40 illustrated in FIG. 28.

Now, a manufacturing process of field effect transistor 40 illustrated in FIG. 28 will be described. FIGS. 31 to 36 are cross sectional views sequentially illustrating cross sectional structures of field effect transistor 40 in respective manufacturing steps (first to sixth steps).

First, as illustrated in FIG. 31, a GaAs layer 47 having a thickness of 40 mn is formed on the surface of a semi-insulating GaAs substrate 41. Then, as illustrated in FIG. 32, a superlattice layer 42 is formed on the surface of GaAs layer 47. Superlattice layer 42 is formed by growing an Al$_{0.35}$Ga$_{0.65}$As layer having a thickness of 6 nm and a GaAs layer having a thickness of 5 nm alternately by eight degrees using a molecular beam epitaxy process. Then, as illustrated in FIG. 33, a GaAs layer 43 and an AlGaAs layer 44 are formed on the surface of superlattice layer 42. Then, as illustrated in FIG. 34, AlGaAs layer 44 and GaAs layer 43 are etched to form a recessed region 48. Then, as illustrated in FIG. 35, two gate electrodes 45, 45 are formed of Ti/Au in recessed region 48. Then, as illustrated in FIG. 36, source/drain electrodes 46, 46 are formed, and field effect transistor 40 illustrated in FIG. 28 is completed.

Now, a field effect transistor 50 according to a conventional second example will be described. FIG. 37 is a cross sectional view illustrating a cross sectional structure of field effect transistor 50 having a number of grating gate electrodes, and such a field effect transistor is disclosed in "Surface-superlattice effects in a grating-gate GaAs/GaAsAlAs modulation doped field-effect transistor" K. Ismail et al. *Applied Physics Letter* Vol. 52, No. 13, Mar. 28, 1988. Referring to FIG. 37, field effect transistor 50 has an intrinsic GaAs layer 52, an intrinsic AlGaAs layer 53, and an n-type AlGaAs layer 54 layered on the surface of a silicon substrate 51. N-type GaAs layers 55, 55 are formed as source/drain regions. A plurality of gate electrodes 56 each having a width of 0.1 μm are arranged in alignment with a pitch of 0.2μm. Potential wells are periodically formed in the substrate by arranging such plurality of grating gate electrodes 56. Field effect transistor 50 having the voltage-current characteristic having an negative characteristic is implemented utilizing the resonant-tunneling effect as described in the above first example.

A field effect transistor according to a conventional third example will be described. FIG. 38 is a cross sectional view showing a cross sectional structure of a field effect transistor 60, and such a structure is disclosed, for example, in "Surface Superlattice Formation in Silicon Inversion Layers Using 0.2 μm Period Grating-Gate Electrodes", A.C. Warren et al., *IEEE Electron Device Letters*, Vol. 6, EDL-6, NO. Jun. 6, 1985, pp. 294–296. As illustrated in FIG. 38, field effect transistor 60 includes a silicon substrate 61 in which a pair of source/drain regions 66, 66 are formed. A plurality of grating gate electrodes 63 are formed on the surface of silicon substrate 61 through a gate insulating film 62. An upper gate electrode 65 is formed on the surface of grating gate electrodes 63 through an insulating layer 64. Silicon substrate 61 is used in field effect transistor 60 of the third example, and potential wells are formed periodically in a channel region between source/drain 66, 66 by the voltage of grating gate electrodes 63. Upper electrode 65 is provided to control the electron density in the potential wells.

A method of manufacturing field effect transistor 60 illustrated in FIG. 38 will be described. FIGS. 39 to 41 are cross sectional views sequentially showing cross sectional structures of field effect transistor 60 in respective manufacturing steps (first to third steps) of a manufacturing process. Referring to FIG. 39, a gate insulating layer 62 and a conductive layer 63a for a gate electrode are formed in a predetermined shape on the surface of a p-type silicon substrate 61. Then, impurity ions 67 are ion-implanted into silicon substrate 61 using conductive layer 63a for the gate electrode as a mask to form source/drain regions 66, 66. Then, as illustrated in FIG. 40, conductive layer 63a for the gate electrode is patterned to form a plurality of grating gate electrodes 63. Then, as illustrated in FIG. 41, the surface of silicon substrate 61 is covered with an interlayer insulating layer 64 and an upper electrode layer 65, and then openings which reach source/drain regions 66, 66 are formed.

All the above conventional three field effect transistors are of a type in which potential wells are formed using a plurality of gate electrodes close to each other.

A field effect transistor utilizing a compound semiconductor as in the cases of conventional first example or second example requires expensive manufacturing apparatuses or materials as compared to the field effect transistor of the third example utilizing a silicon substrate, and this is not favorable in respect of the cost. While it is necessary to process a gate electrode to have a small width and to form a plurality of gate electrodes arranged with a small pitch particularly in a structure having potential wells formed by the gate electrodes as in the case of the field effect transistor in the second or third example, such fine processing is difficult in manufacture. If potential barriers are formed by making a plurality of gate electrodes close to each other, the width of the barriers is extended in the channel direction, and it is difficult to form a sharp well type potential. Therefore, there is also a problem of that the efficiency of tunneling is low, and current flowing by the quantum resonant effect is smaller than current flowing by jumping over the potential barriers by thermal excitation.

SUMMARY OF THE INVENTION

An object of the present invention is to provide a field effect element having a large resonant-tunneling effect.

Another object of the present invention is to provide a field effect element utilizing resonant-tunneling whose manufacturing process is easy.

Still another object of the present invention is to provide a method of manufacturing a field effect transistor having a large resonant-tunneling effect.

A field effect element according to the present invention includes a substrate having a main surface, a pair of source/drain conductive layers formed on the surface of the substrate spaced a predetermined distance from each other, an insulating layer formed on the main surface of the substrate, a gate electrode formed on the surface of the insulating layer, and a channel region formed in the substrate along the surface of the substrate in the pair of source/drain regions. First and second semiconductor layers formed of a material having a bandgap larger than that of silicon are arranged in the channel region between silicon layers, spaced a predetermined distance along the direction of movement of majority carriers.

A method of manufacturing a field effect element according to another aspect of the present invention includes the following steps. First, an amorphous layer is formed on a main surface of a first silicon substrate. Then, a second silicon substrate is brought in contact with the amorphous layer. Then, heat treatment is carried on the first and second silicon substrates in contact with each other to cause solid phase growth of the amorphous layer and to make it into single crystal so that the thickness of the amorphous layer is reduced. The second silicon substrate is etched to leave a monocrystalline silicon layer having a predetermined thickness on the surface of the amorphous layer. Then, impurities are introduced into a predetermined region of the surface of the monocrystalline silicon layer to form an impurity region. A trench extending from the surface of the monocrystalline silicon layer into the first silicon substrate is formed to electrically separate the impurity region onto both sides of the trench. Then, an insulating layer is formed inside the trench and on the surface of the impurity region. A conductive layer is formed on the surface of the insulating layer and patterned to form a gate electrode.

A method of manufacturing a field effect element according to still another aspect of the present invention includes the following steps. First, an amorphous layer is formed on a main surface of a first silicon substrate. Then, a second silicon substrate covered with an oxide film having an opening to expose the surface of monocrystalline silicon is formed on the surface of the amorphous layer on the first silicon substrate to bring the surface of the amorphous layer on the first silicon substrate and the surface of monocrystalline silicon of the second silicon substrate in contact with each other. Heat treatment is carried out on the first and second silicon substrates in contact with each other to cause solid phase growth of the amorphous layer to make it into single crystal so that an amorphous layer having a reduced thickness and extending from the silicon surface of the first silicon substrate in the direction of the depth of the substrate is formed. Then, the second silicon substrate is removed to expose the surface of the silicon layer made into single crystal and the surface of the amorphous layer having a reduced thickness. Then, an insulating layer is formed on the exposed surfaces of the silicon layer and the amorphous layer. A conductive layer is formed on the surface of the insulating layer and patterned to form a gate electrode.

A method of manufacturing a field effect element according to a further aspect of the present invention includes the following steps. First, an amorphous layer is formed in a part of a region to be a channel region on a main surface of a first silicon substrate. Then, a second silicon substrate is formed on the main surface of the first silicon substrate, and the surface of the second silicon substrate and the surface of the amorphous layer are brought in contact with each other. Heat treatment is carried out on the first and second silicon substrates in contact with each other to cause solid phase growth of the amorphous layer to make it into single crystal so as to form an amorphous layer having a reduced thickness and extending from the main surface of the first silicon substrate in the direction of the depth of the substrate. Then, the second silicon substrate is removed to expose the surface of the silicon layer made into single crystal, the surface of the amorphous layer having a reduced thickness, and the surface of the first silicon substrate. An insulating layer is formed on the exposed surface of the silicon layer, the surface of the amorphous layer, and the surface of the first silicon substrate. Then, a conductive layer is formed on the surface of the insulating layer and patterned to form a gate electrode layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS 3 and 3A illustrate a band diagram of the field effect transistor illustrated in FIG. 1.

FIGS. 15 and 15A illustrate a band diagram of the field effect transistor illustrated in FIG. 14.

DESCRIPTION OF THE PREFERRED EMBODIMENTS

Figure 1:
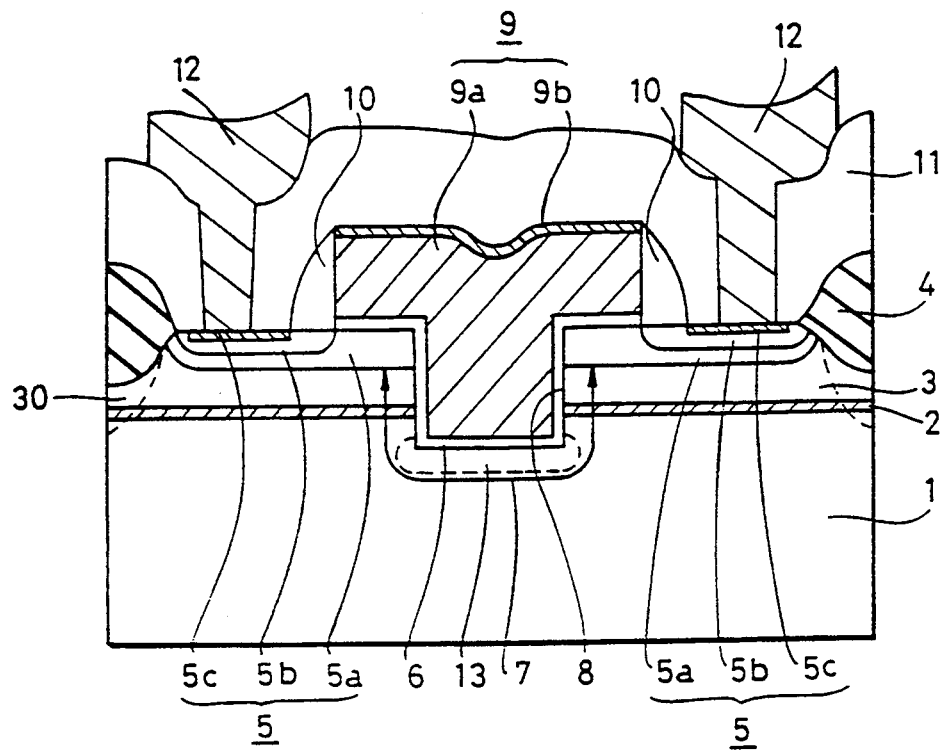
FIG. 1 is a cross sectional view illustrating a cross section structure of a field effect transistor according to a first embodiment of the present invention taken along line X—X in FIG. 2.
Figure 2:
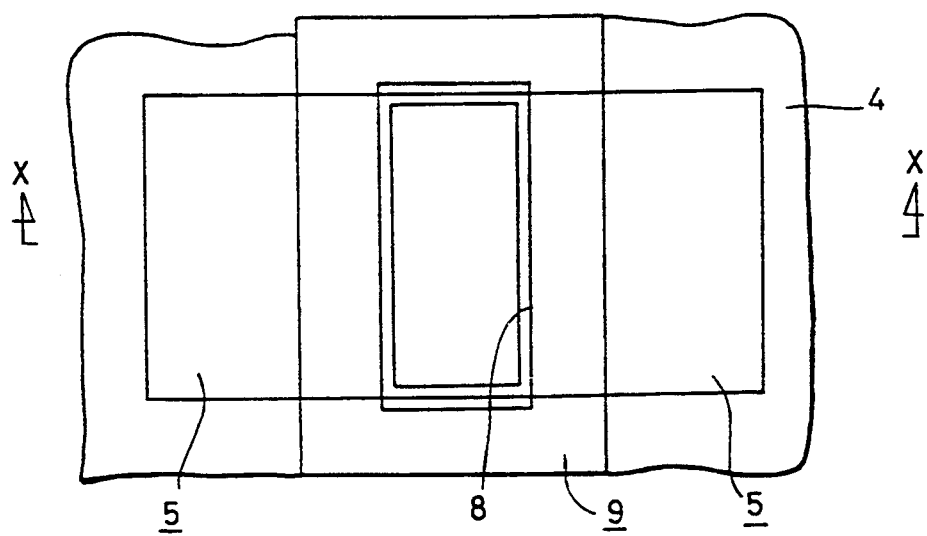
FIG. 2 is a plan view illustrating a planar structure of the field effect transistor according to the first embodiment of the present invention.

First, a first embodiment of the present invention will be described. Referring to FIGS. 1 and 2, a substrate in a field effect transistor has a layered structure including a first silicon monocrystalline substrate 1, an amorphous silicon layer 2, and a second silicon monocrystalline substrate 3. First silicon monocrystalline substrate 1 is a p-type substrate having a crystal orientation of $<001>$. Second silicon monocrystalline substrate 3 is a p-type substrate having a crystal orientation of $<111>$. Amorphous silicon layer 2 between first and second silicon monocrystalline substrates 1 and 3 is formed to have a thickness in the range of tens of angstroms to 100Å. Second silicon monocrystalline substrate 3 is formed to have a thickness of about 0.2 μm. A pair of source/drain regions 5, 5 are formed on the surface of second silicon monocrystalline substrate 3 and surrounded by a field oxide film 4. A channel stop region 30 for preventing inversion is formed beneath field oxide film 4. Source/drain region 5 is formed of an n-type first impurity region 5a and a second impurity region 5b. A metal silicide layer 5c is formed on the surface of second impurity region 5b.

A trench 8 extending through second silicon monocrystalline substrate 3, amorphous silicon layer 2, and first silicon monocrystalline substrate 1 is formed in the central part of the substrate. Trench 8 is formed to have a depth of approximately 0.3 μm and a width of approximately 0.1 μm. A gate insulating film 6 having a thickness of approximately 0.01 μm is formed on the inner surface of trench 8 and on the surface of second silicon monocrystalline substrate 3. A gate electrode 9 including a polycrystalline silicon layer 9a and a metal silicide layer 9b is formed on the surface of gate insulating film 6. Sidewall insulating films 10, 10 are formed on the sidewalls of gate electrode 9. The surface of the substrate is covered with an interlayer insulating layer 11, and interconnection layers 12 are connected to the surfaces of source/drain regions 5, 5 through openings formed in interlayer insulating layer 11.

As indicated by arrows in the drawing, a channel region 7 is formed in a region along the inner surface of trench 8 extending from one source/drain region 5 to the other source/drain region 5. A boron implanted region 13 is formed in the bottom part of trench 8 for making the transistor into an enhancement-type transistor. The structure of the field effect transistor is characterized by sequential arrangement along the arrows of channel region 7 of second silicon monocrystalline substrate 3, amorphous silicon layer 2, first silicon monocrystalline substrate 1, amorphous silicon layer 2, and second silicon monocrystalline substrate 3.

Figure 3:
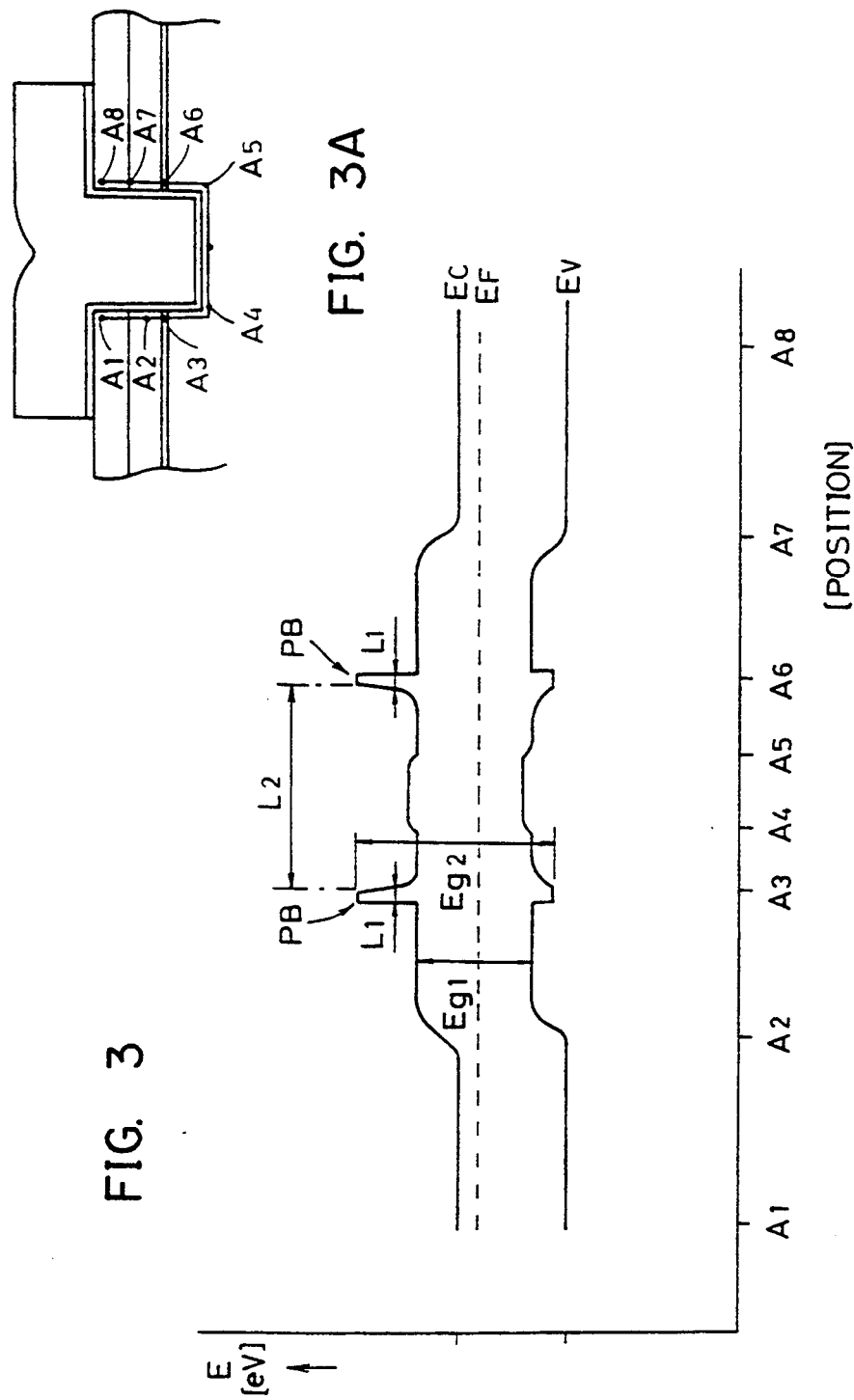
Figure 30:
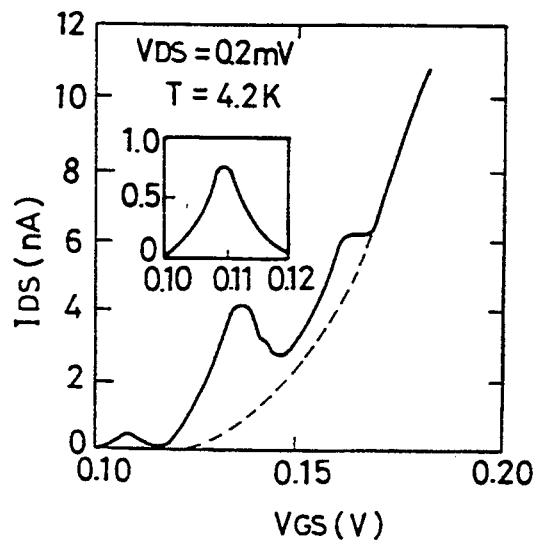
FIG. 30 is a graph showing the current-voltage characteristic of the field effect transistor illustrated in FIG. 28.
Figure 31:
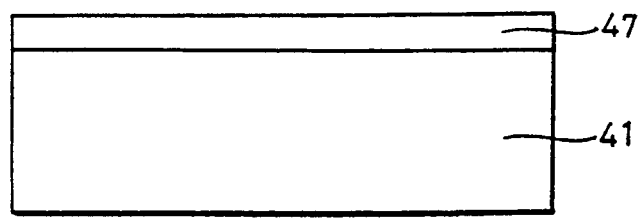
FIGS. 31–36 are cross sectional views sequentially illustrating the field effect transistor illustrated in FIG. 28 in respective steps of a manufacturing process thereof.
Figure 32:
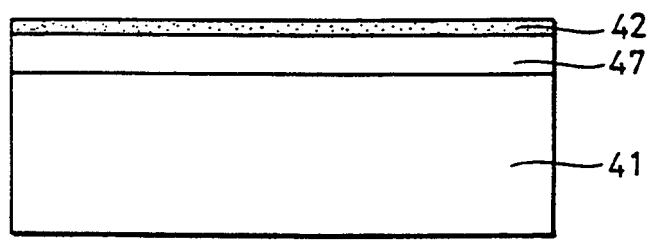
Figure 33:
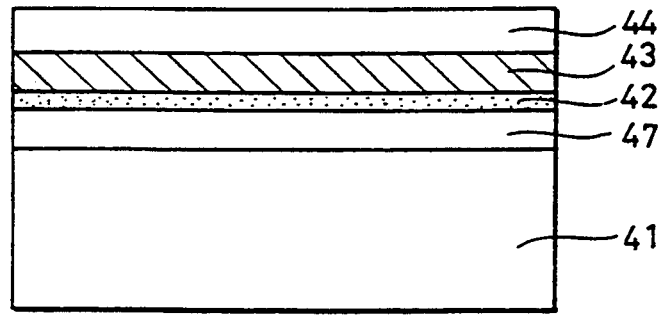
Figure 34:
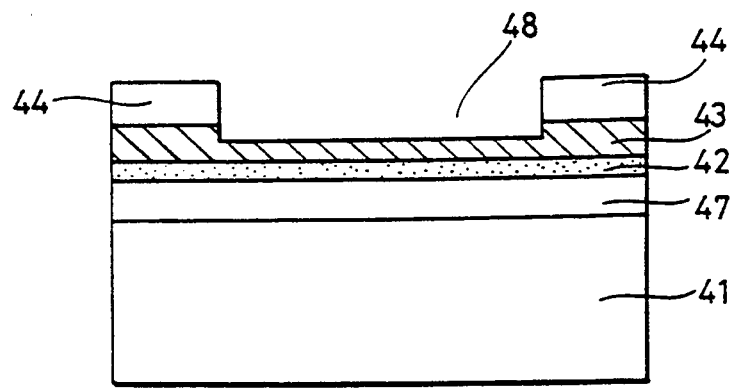
Figure 35:
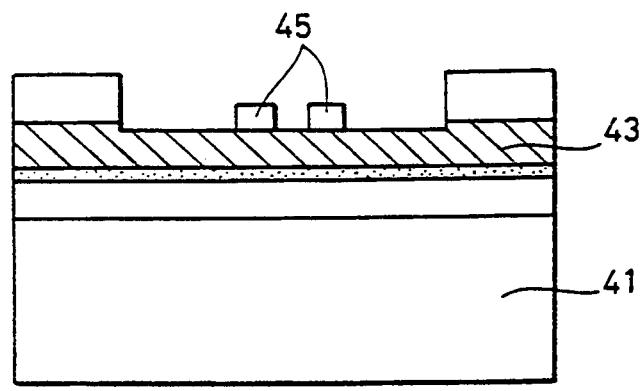
Figure 36:
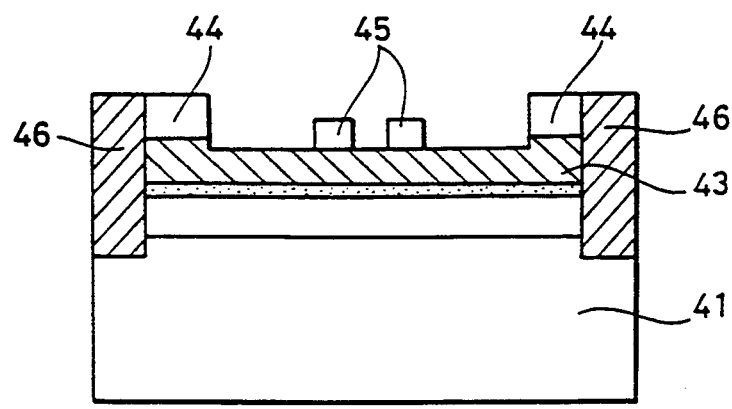
Figure 37:
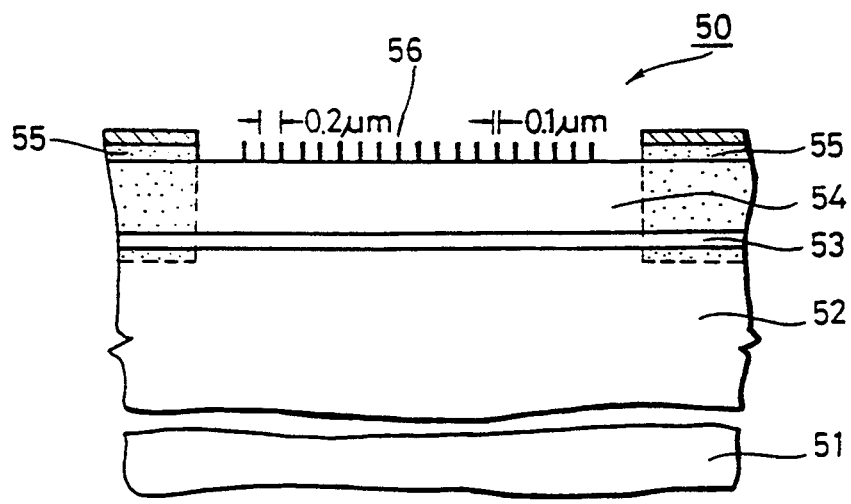
FIG. 37 is a cross sectional view illustrating a cross sectional structure of a field effect transistor according to a conventional second example.
Figure 38:
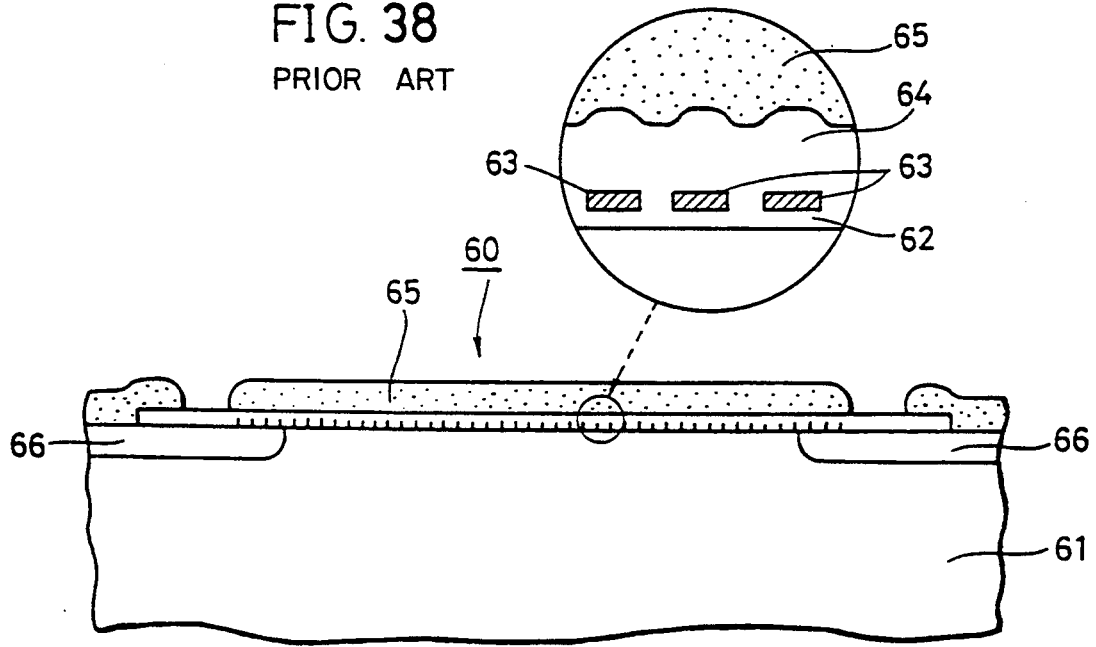
FIG. 38 is a cross sectional view illustrating a cross sectional structure of a field effect transistor according to a conventional third example.
Figure 39:
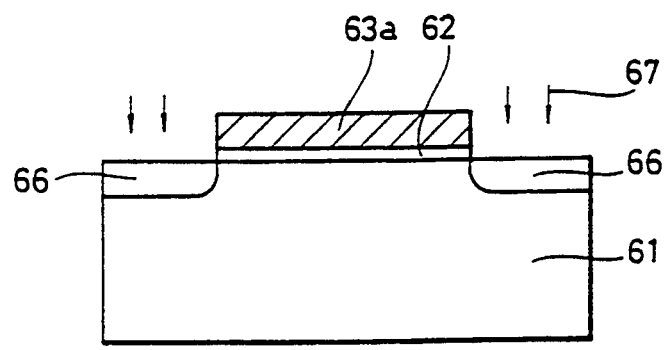
FIG. 39–41 are cross sectional views sequentially illustrating the field effect transistor illustrated in FIG. 38 in respective steps of a manufacturing process.
Figure 40:
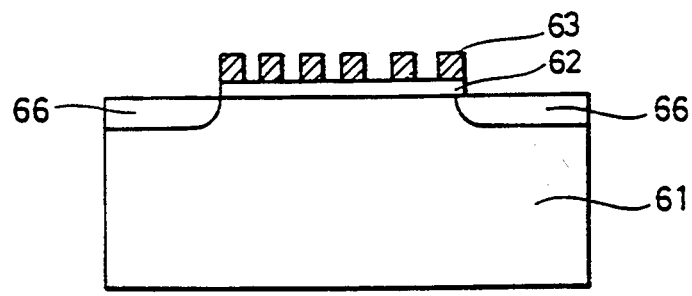
Figure 41:
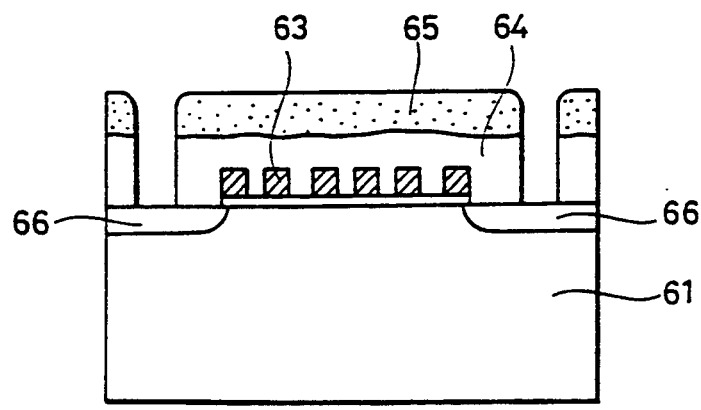

Referring to FIG. 3, the energy gap $E_{g1}$ of monocrystalline silicon is approximately 1.1 eV, and the bandgap $E_{g2}$ of amorphous silicon is approximately 1.8 eV, so that potential barriers PB of approximately 0.3 eV to approximately 0.4 eV are generated in the conduction band. Therefore, normally, only electrons having energy larger than the potential barriers PB can pass jumping over the potential barriers PB. However, a field effect transistor according to the present invention utilizes a phenomenon in which a barrier is passed by the resonant-tunneling effect. Specifically, if the distance $L_2$ between the potential barriers PB, PB formed by two amorphous silicon layers 2, 2 is made small, the energy levels in the region between the two barriers are quantized to form a quantum well. If the thickness of amorphous silicon layer 2 is reduced, the width $L_l$ of potential barriers PB is reduced, and the probability that electrons in the outer part between the barriers pass the barriers by the tunneling effect is increased. Only electrons having energy equal to the energy levels in the quantum well between the two potential barriers PB, PB pass the potential barrier PB by the tunneling effect. According to the relation between the voltage between the source and drain and the gate voltage, the ratio of such electrons passing the potential barrier by the resonant-tunneling effect depends on the discrete energy levels in the quantum well. Accordingly, a field effect transistor having negative resistance in the characteristic of the current and voltage between the source and drain is obtained. The current/voltage characteristic of the field effect transistor illustrated in FIG. 1 is similar to the characteristic having negative resistance regions illustrated in FIG. 30. The field effect transistor having such periodic peak regions of the source/drain current can be used as an element such as a multiple-valued memory, for example.

Figure 4:
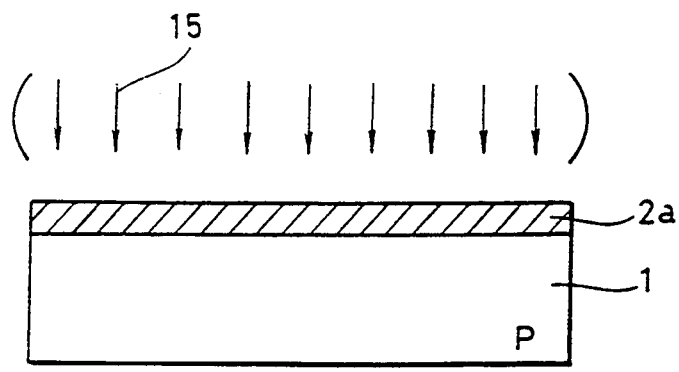
FIGS. 4–12 are cross sectional views sequentially illustrating the field effect transistor illustrated in FIG. 1 in respective steps of a manufacturing process thereof.

Now, a method of manufacturing the field effect transistor illustrated in FIG. 1 will be described. First, as illustrated in FIG. 4, an amorphous layer 2 is formed on the surface of a p-type first silicon monocrystalline substrate 1 having an orientation of <001>. First silicon substrate 1 has a thickness of approximately 500 μm and resistivity of 20 Ωcm. Amorphous silicon layer 2 can be formed by two methods. A first method is a method in which quadrivalent atoms such as germanium (Ge) and silicon (Si) are ion-implanted into the surface of the first substrate to make the surface of the silicon substrate be amorphous. When an amorphous silicon layer 2a having a thickness of 0.1 μm is formed, for example, ion implantation is carried out with implantation energy of 160 keV and a dose of $1 \times 10^{14}/cm^2$ or more in the case of Ge ions, and it is carried out with implantation energy of 80 keV and a dose of $1 \times 10^{15}/cm^2$ or more in the case of Si ions. A second method is a method in which an amorphous silicon layer 2a is deposited directly on the surface of silicon substrate 1 by a low temperature CVD process (Chemical Vapor Deposition) or a glow discharge process.

Figure 5:
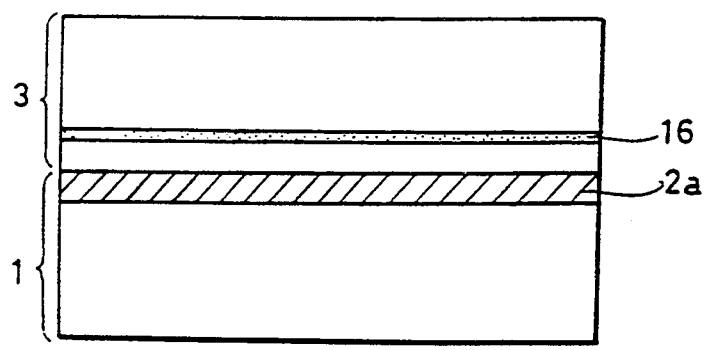

Then, as illustrated in FIG. 5, a second silicon monocrystalline substrate 3 is provided. Second silicon substrate 3 is a p-type substrate having a crystal orientation of <111>, a thickness of approximately 500 μm, and resistivity of approximately 20 Ωcm. Boron ions are implanted into a predetermined position in second silicon substrate 3, for example, into a position at a depth of approximately 0.1 μm from the surface joined to amorphous silicon layer 2 to form an etching stop layer 16. Second silicon monocrystalline substrate 3 is made in contact with the surface of amorphous silicon layer 2a of first silicon monocrystalline substrate 1.

Figure 6:
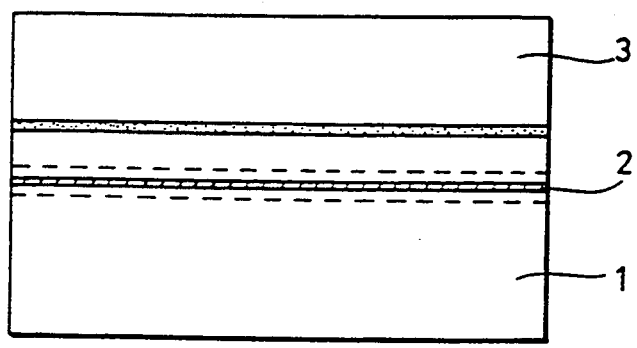

Then, as illustrated in FIG. 6, annealing processing is carried out at a temperature in the range of 800° C. to 1000° C. for about one hour, holding the contact between silicon substrates 1 and 3. The annealing processing causes solid phase growth of amorphous silicon layer 2a to start from the surface of first monocrystalline silicon substrate 1 and from the surface of second silicon monocrystalline substrate 3, and both silicon substrates 1, 3 are joined to each other. A thermally stable thin layer 2 of amorphous silicon is formed in a region where the solid growth generated from the surface of silicon substrate 1 and the solid growth generated from the surface of silicon substrate 3 meet. Amorphous silicon layer 2 is formed to have a thickness in the range of about tens of angstroms to 100Å, for example. Such a method of joining silicon substrates is referred to as a wafer directly joining method and reported, for example, in *Applied Surface Science* 41/42 Furukawa, 1989, pp. 627–632.

Figure 7:
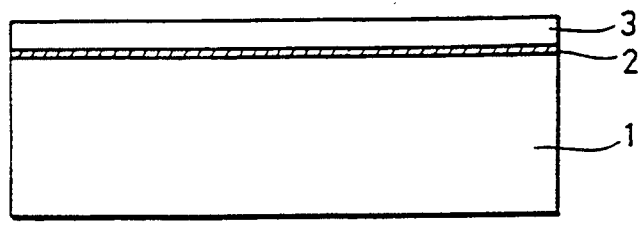

Then, as illustrated in FIG. 7, second silicon monocrystalline substrate 3 is immersed in an aqueous solution of ethylenediamine and pyrocatechol to be removed up to the surface of etching stop layer 16. Etching stop layer 16 of high concentration including boron of $1 \times 10^{18}/cm^3$ or more has large selectivity, so that it functions as an etching stopper in the etching step. Then etching stop layer 16 is removed by reactive ion etching. This makes monocrystalline silicon layer 3 remaining on the surface of amorphous silicon layer 2 have a thickness of approximately 0.1 μm.

Figure 8:
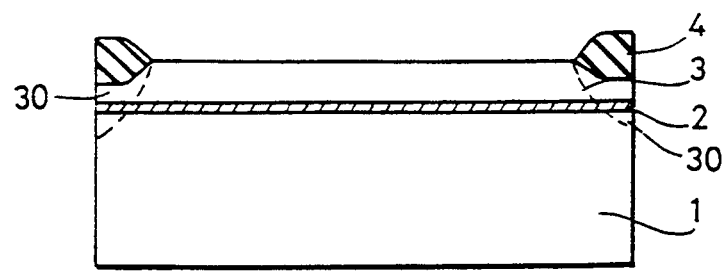

Then, as illustrated in FIG. 8, field oxide films 4 for isolating elements are formed in predetermined regions on the surface of second silicon monocrystalline layer 3 by a local oxidation process. Channel stop layers 30 for preventing inversion are formed beneath field oxide films 4.

Figure 9:
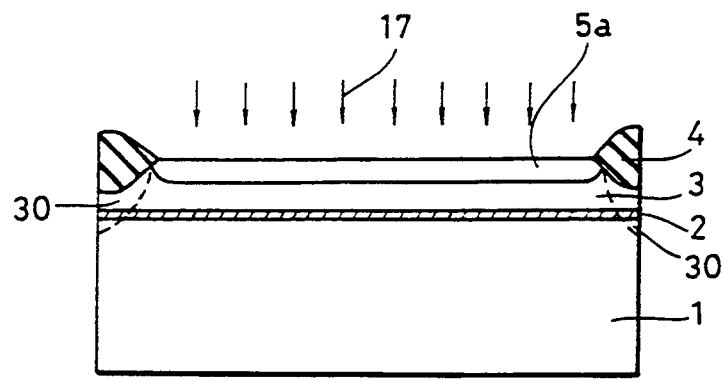

Then, as illustrated in FIG. 9, arsenic ions 17 are ion-implanted in the surface of second silicon monocrystalline layer 3 with implantation energy of 30 KeV and a dose in the range of $10^{13}/cm^2$ to $10^{15}/cm^2$ to form an n-type impurity region 5a.

Figure 10:
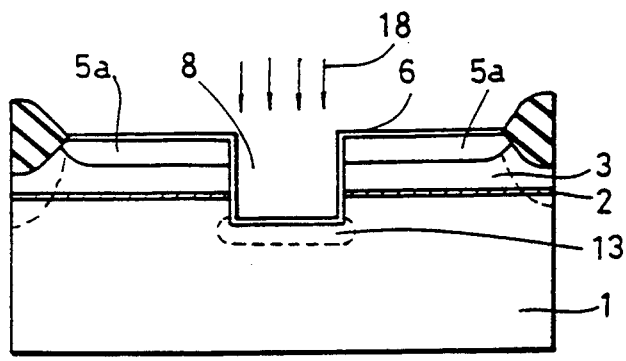

Then, as illustrated in FIG. 10, a trench 8 extending from the surface of second silicon monocrystalline layer 3 to first silicon monocrystalline substrate 1 is formed by etching. Trench 8 is formed to have the width of the opening of 0.05 μm–0.1 μm and a depth of 0.12 μm. Boron ions 18 are implanted in the bottom part of trench 8 with implantation energy of 30 keV and a dose of $2 \times 10^{12}/cm^2$ to form a boron implanted region 13. Then, a gate insulating film 6 having a thickness of 70Å is formed on the inner surface of trench 8 and on the surface of impurity region 5a by a CVD process or a thermal oxidation process.

Figure 11:
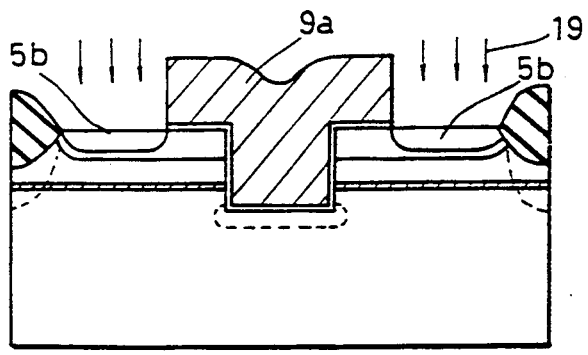

Then, as illustrated in FIG. 11, a polycrystalline silicon layer doped with phosphorus is deposited on the whole surface of the substrate and patterned using a lithography process and an etching process. A polycrystalline silicon layer 9a of a gate electrode is formed by this. Then, arsenic ions 19 are implanted in the surface of impurity region 5a using polycrystalline silicon layer 9a as a mask with implantation energy of 30 keV and a dose of $1\times10^{15}/cm^2$, and then annealing processing is carried out at a temperature of 700° C. for 60 minutes. A second impurity region 5b of high concentration is formed by this. The second impurity region is formed for lowering the resistance of the source/drain regions.

Figure 12:
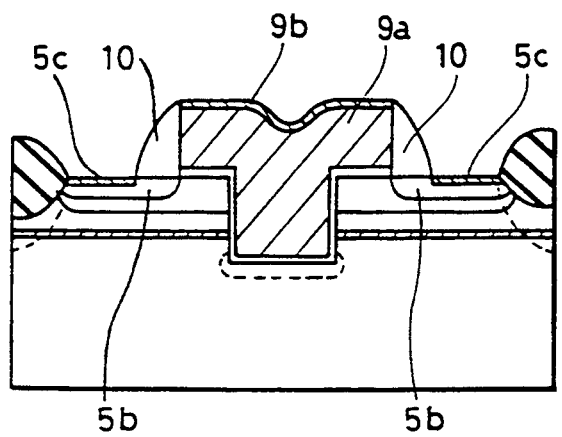

Then, as illustrated in FIG. 12, a low temperature insulating film is formed on the whole surface of the substrate and then removed by anisotropic etching. Sidewall insulating films 10, 10 are formed on the sidewalls of polycrystalline silicon layer 9a of the gate electrode by this. Then, a titanium layer having a thickness of 300Å is deposited on the whole surface, and annealing processing is carried out in an atmosphere of nitrogen at a temperature of 600° C. Titanium silicide layers 5c, 9b are formed on the surfaces of second impurity regions 5b of the source/drain regions and on the surface of polycrystalline silicon layer 9a of the gate electrode. Then, unreacted titanium layer formed on sidewall insulating layers 10, 10 and the like is selectively removed using sulfuric acid or the like.

Then, an interlayer insulating layer is formed, a contact hole is opened, and an aluminum interconnection layer is patterned to manufacture the field effect transistor illustrated in FIG. 1.

Figure 13:
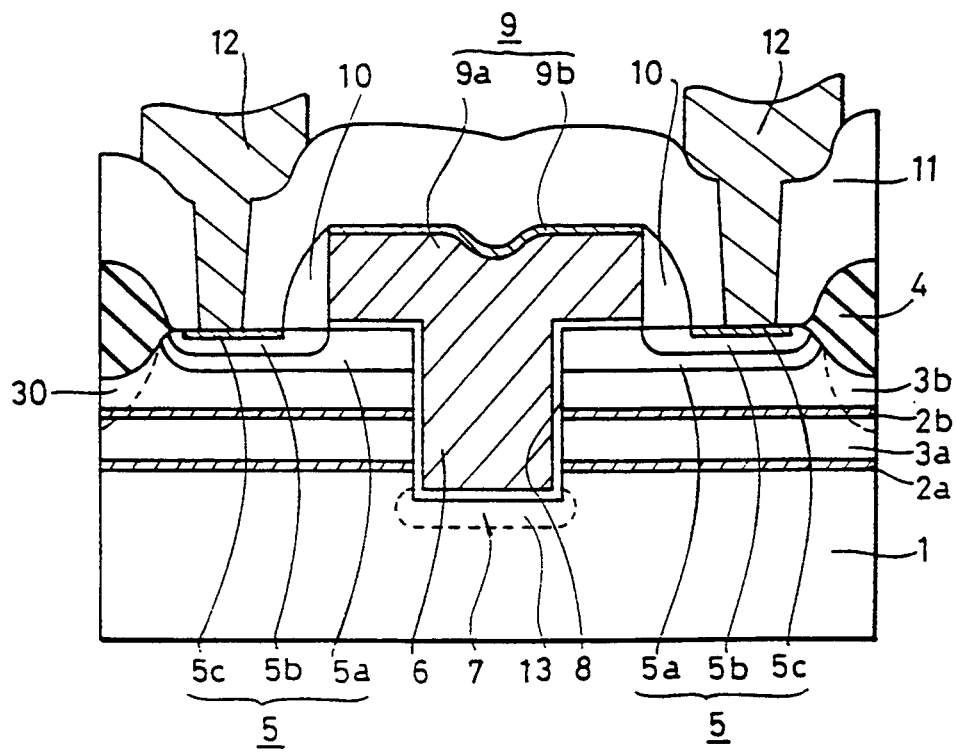
FIG. 13 is a cross sectional view illustrating a cross sectional structure of a field effect transistor according to a second embodiment of the present invention.

Now, a structure of a field effect transistor according to a second embodiment of the present invention will be described. FIG. 13 is a cross sectional view illustrating a cross sectional structure of a field effect transistor according to a second embodiment. The second embodiment differs from the first embodiment in that the amorphous silicon layer formed in the channel region is of four layers. Therefore, four adjacent potential barriers corresponding to amorphous silicon layers 2a, 2b are formed in the channel region. Such a structure can be implemented by repeatedly carrying out from the step illustrated in FIG. 4 to the step illustrated in FIG. 7 in the manufacturing process of the first embodiment.

Figure 14:
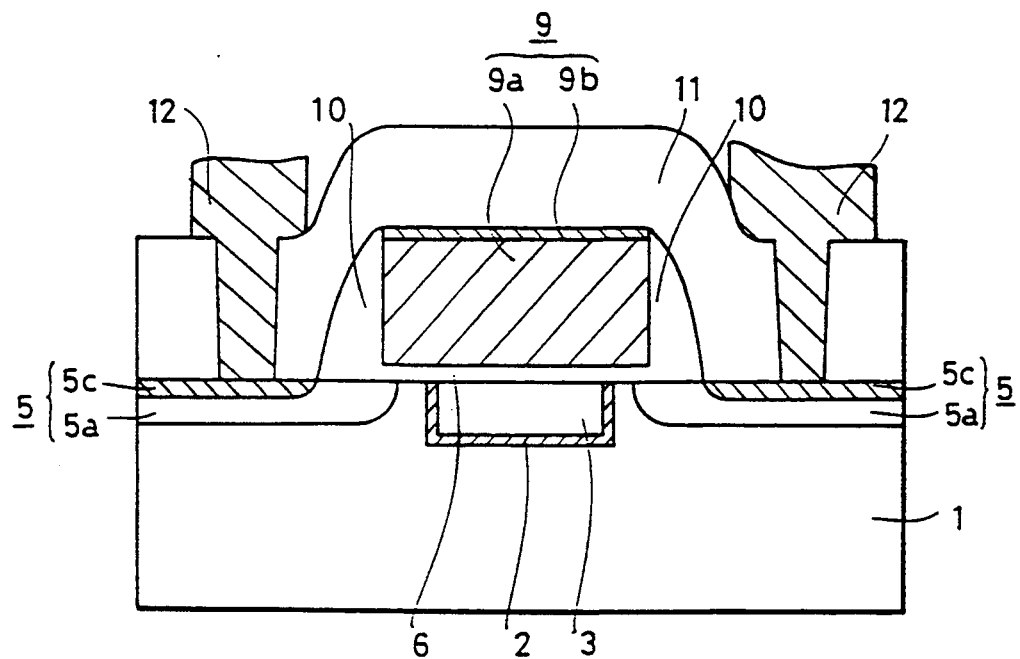
FIG. 14 is a cross sectional view illustrating a cross sectional structure of a field effect transistor according to a third embodiment of the present invention.

Next, a third embodiment of the present invention will be described. FIG. 14 is a cross sectional view illustrating a cross sectional structure of a field effect transistor according to a third embodiment. The field effect transistor illustrated in FIG. 14 has the surface of a substrate formed flat. A channel region formed between source/drain regions 5, 5 is also formed flat along the surface of the substrate. A thin amorphous silicon layer 2 is formed in a box shape including a pair of vertical regions extending in the direction of the depth of the substrate so as to prevent movement of majority carriers in the channel region and a bottom surface extending parallel with the surface of the substrate. A second silicon monocrystalline layer 3 is formed inside amorphous silicon layer 2.

Figure 15:
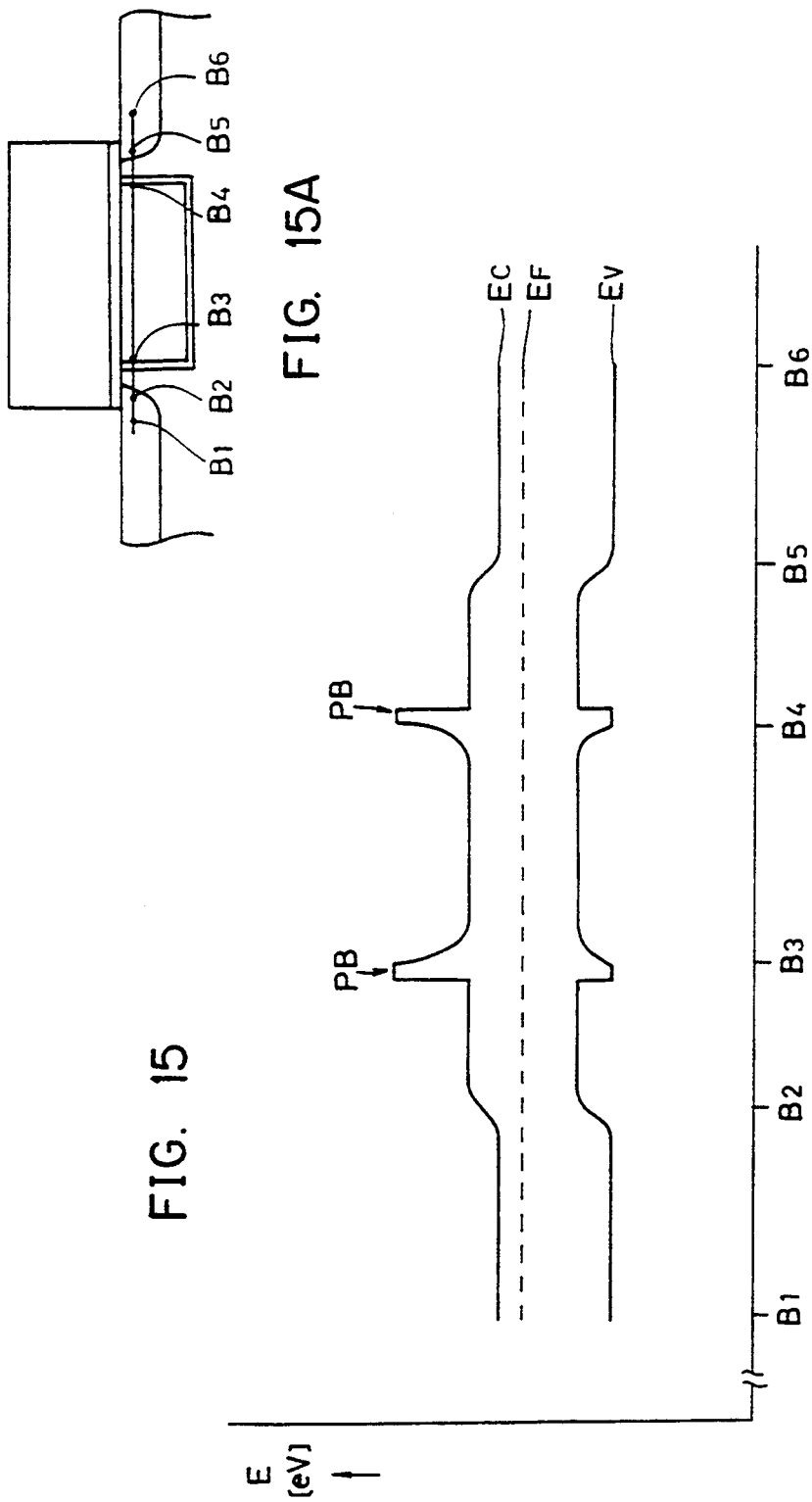

FIG. 15 is a band diagram of the channel region of the field effect transistor illustrated in FIG. 14. As illustrated in FIG. 15, two potential barriers PB are formed in the conduction band, corresponding to the pair of vertical regions of the amorphous silicon layer. The third embodiment has the same band structure as that of the first embodiment. However, the third embodiment differs from the first embodiment in that the channel region is formed parallel with the surface of the substrate. It is also possible to obtain a current-voltage characteristic brought by the resonant-tunneling effect by a field effect transistor having such potential barriers as in the case of the first embodiment.

Now, a method of manufacturing the field effect transistor according to the third embodiment illustrated in FIG. 14 will be described.

Figure 16:
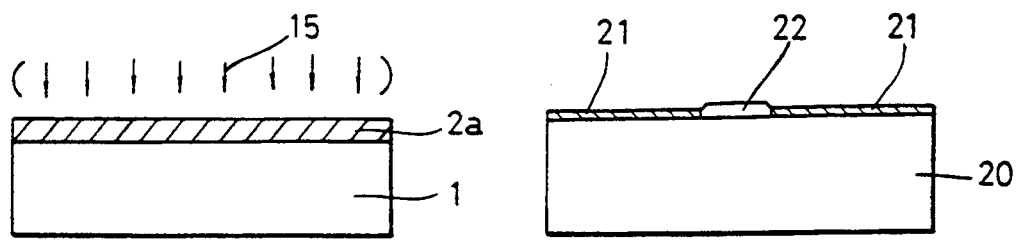
FIGS. 16–21 are cross sectional views sequentially illustrating the field effect transistor illustrated in FIG. 14 in respective steps of a manufacturing process thereof.

First, as illustrated in FIG. 16, a first silicon monocrystalline substrate 1 and a second silicon monocrystalline substrate 20 are provided. First silicon monocrystalline substrate 1 is a p-type silicon substrate having an orientation of <001>, a thickness of approximately 500 μm, and resistivity of approximately 20 Ωcm. An amorphous silicon layer 2a having a thickness of 0.1 μm is formed on the surface of first silicon monocrystalline substrate 1. The same formation method as the one described in the step illustrated in FIG. 4 is used for forming the amorphous silicon layer. Second silicon monocrystalline substrate 20 is a p-type silicon substrate having an orientation of <111>, a thickness of approximately 500 μm, and resistivity of approximately 20 Ωcm. A silicon oxide film 21 having a thickness of 50 nm is formed on the surface of second silicon monocrystalline substrate 20 by thermal oxidation. Then, an opening having a width of 0.1 μm is formed in silicon oxide film 21 by a lithography process and an etching process. Epitaxial growth is selectively made inside the opening to form a silicon monocrystalline region 22.

Figure 17:
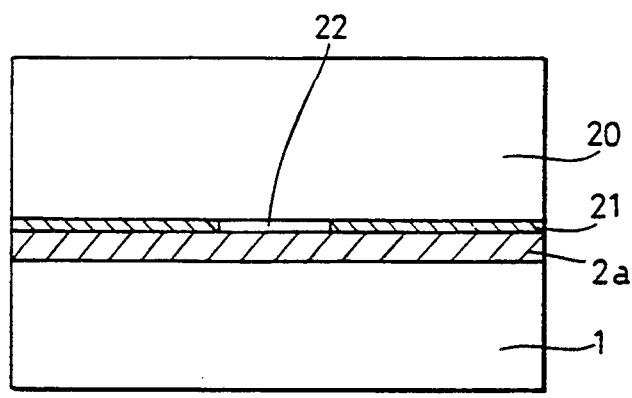

Then, as illustrated in FIG. 17, first silicon substrate 1 and second silicon substrate 20 are brought in contact with each other. At this time, amorphous silicon layer 2a in first silicon substrate 1 and silicon monocrystalline region 22 in second silicon substrate 20 are set to be in contact with each other.

Figure 18:
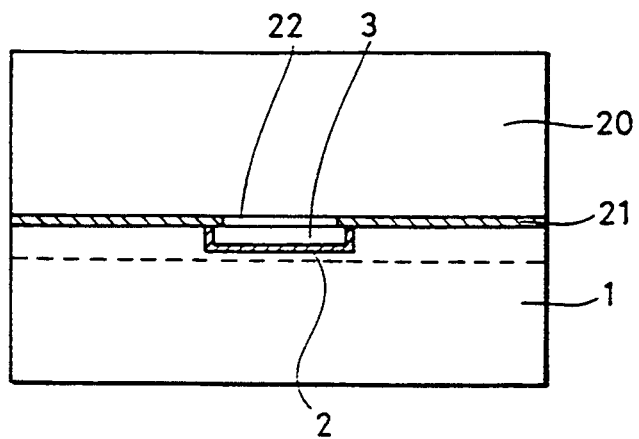

Then, as illustrated in FIG. 18, annealing processing is carried out at a temperature in the range of 800° C. to 1000° C., holding the contact between substrates 1 and 20, to forth a thin amorphous silicon layer 2. As the result of solid phase growth of amorphous silicon layer 2a shown in FIG. 17 made from both of the surface of silicon monocrystalline region 22 and the surface of first silicon monocrystalline substrate 1, amorphous silicon layer 2 is formed in the position of the boundary of the surfaces of growth.

Figure 19:
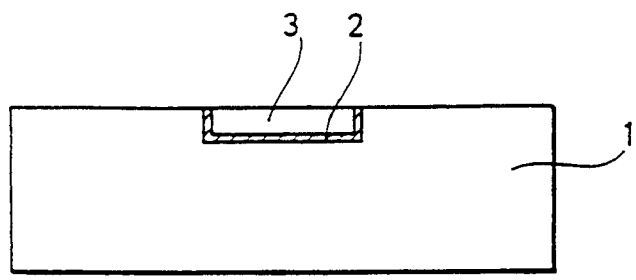

Then, as illustrated in FIG. 19, second silicon monocrystalline substrate 20 and oxide film 21 are removed by etching. The surfaces of first silicon monocrystalline substrate 1 and second silicon monocrystalline layer 3 are formed flat by this.

Figure 20:
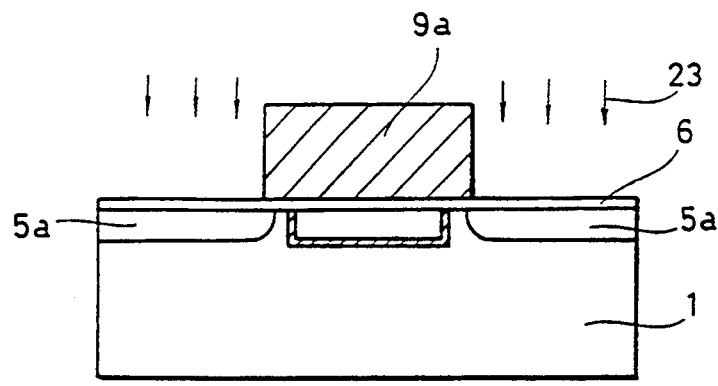

Then, as illustrated in FIG. 20, a gate insulating layer 6 is formed on the whole surface, and a polycrystalline silicon layer doped with phosphorus is deposited thereon and patterned to form a polycrystalline silicon layer of 9a a gate electrode. n-type impurity ions 23 such as phosphorus or arsenic are ion-implanted into the surface of first silicon monocrystalline substrate 1 using polycrystalline silicon layer 9a as a mask. A pair of source/drain regions 5a, 5a are formed by the ion implantation.

Figure 21:
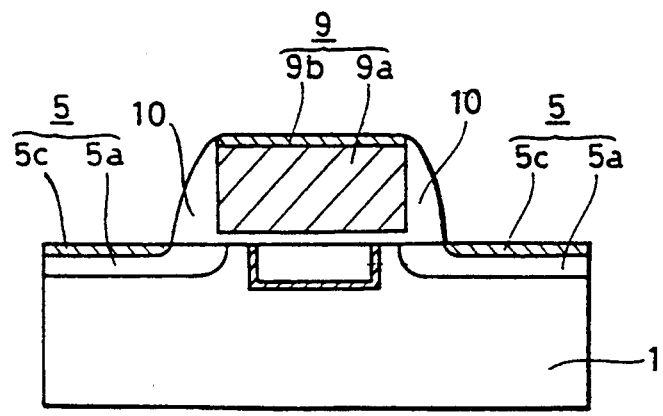

Then, as illustrated in FIG. 21, sidewall insulating layers 10, 10 are formed on the sidewalls of polycrystalline silicon layer 9a for the gate electrode. Titanium silicide layers 5c, 9b are formed on the surfaces of impurity regions 5a, 5a and polycrystalline silicon layer 9a by the same method as the one described in the step illustrated in FIG. 12.

Then, an interlayer insulating layer 11 is formed, and an interconnection layer 12 is formed to complete the field effect transistor illustrated in FIG. 14.

Figure 22:
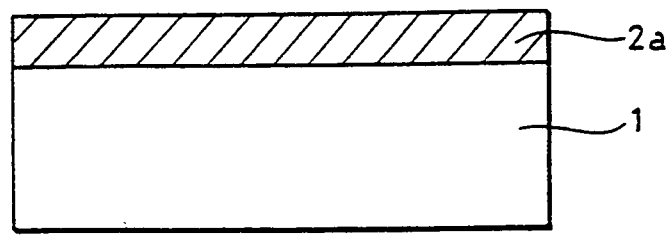
FIGS. 22–24 are cross sectional view sequentially illustrating the field effect transistor illustrated in FIG. 14 in respective steps of an example of a variation of a manufacturing process thereof.

Now, an example of a variation of the method of manufacturing the field effect transistor according to the third embodiment will be described. First, as illustrated in FIG. 22, an amorphous silicon layer 2a is formed on the surface of a p-type silicon substrate 1 having an orientation of <111>. Amorphous silicon layer 2a is formed by the same formation method as the one described in the first embodiment and the third embodiment.

Figure 23:
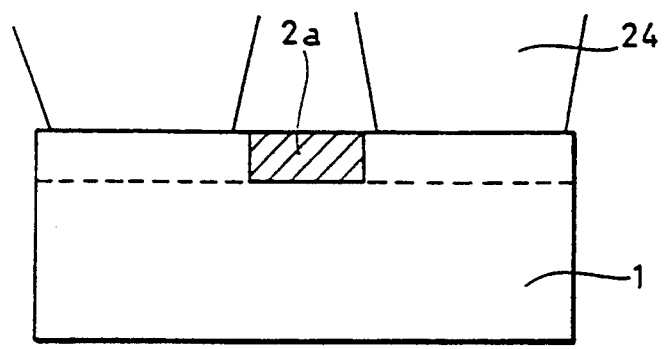

Then, as illustrated in FIG. 23, collected energy lines are irradiated to a desired region in amorphous silicon layer 2a to cause solid phase growth of amorphous silicon layer 2a to make it selectively epitaxial to the <111>axis. This causes amorphous silicon layer 2a to be formed only in the desired region on the surface of first silicon monocrystalline substrate 1.

Figure 24:
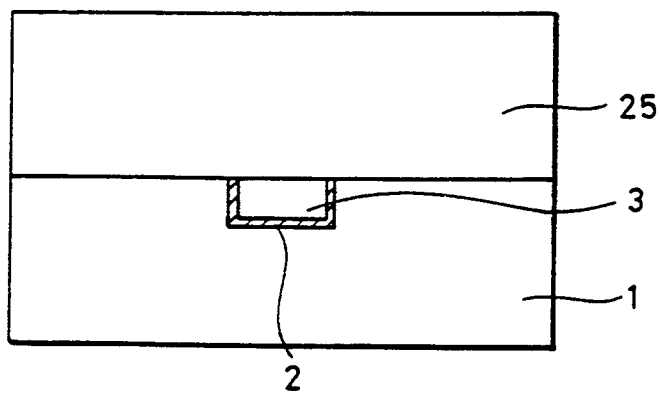

Then, as illustrated in FIG. 24, a second silicon monocrystalline substrate 25 having a different crystal orientation is formed in contact with the surface of first silicon monocrystalline substrate 1. Annealing processing is carried out, holding the contact, to produce solid phase growth only from the surface of second silicon monocrystalline substrate 25 in contact with the surface of amorphous silicon layer 2a, and, as a result, a concave thin amorphous silicon layer 2 is formed. Then, second silicon monocrystalline substrate 25 is removed. Then, the steps illustrated in FIGS. 20 and 21 are successively carried out.

Figure 25:
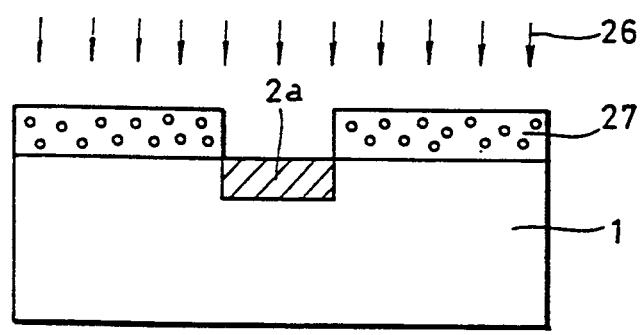
FIGS. 25 and 26 are cross sectional views sequentially illustrating the field effect transistor illustrated in FIG. 14 in respective steps of another example of a variation of a manufacturing process thereof.
Figure 26:
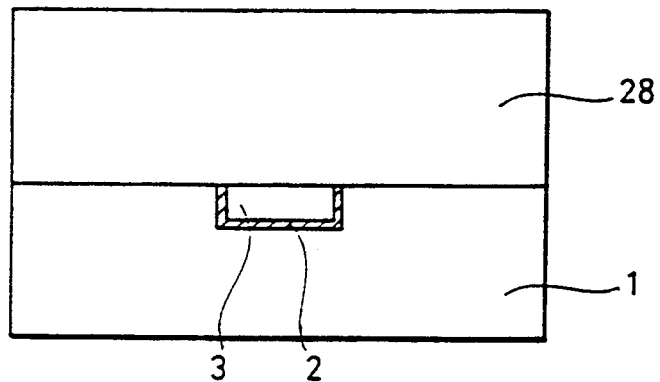

Now, another example of a variation of the formation process of thin amorphous silicon layer 2 will be described. FIGS. 25 and 26 are cross sectional views illustrating an example of a variation of the steps illustrated in FIGS. 16 to 18.

As illustrated in FIG. 25, a resist pattern 27 having an opening only in a predetermined region is formed on the surface of first silicon monocrystalline substrate 1. Ion beams 26 of Ge or Si are irradiated to the surface of the substrate using the resist pattern 27 as a mask to form an amorphous silicon layer 2a. Amorphous silicon layer 2a may be formed by irradiating converged ion beams 26 into only a desired position instead of using resist pattern 27.

Then, as illustrated in FIG. 26, a second silicon monocrystalline substrate 28 is formed in contact with the surface of first silicon monocrystalline substrate 1, and annealing processing is carried out. This produces solid phase growth only from the side of the surface of second silicon monocrystalline substrate 28 to form a concave thin amorphous silicon layer 2. Then, second silicon monocrystalline substrate 28 is removed. Then, the step in FIG. 20 and later steps in the third embodiment are carried out.

Figure 27:
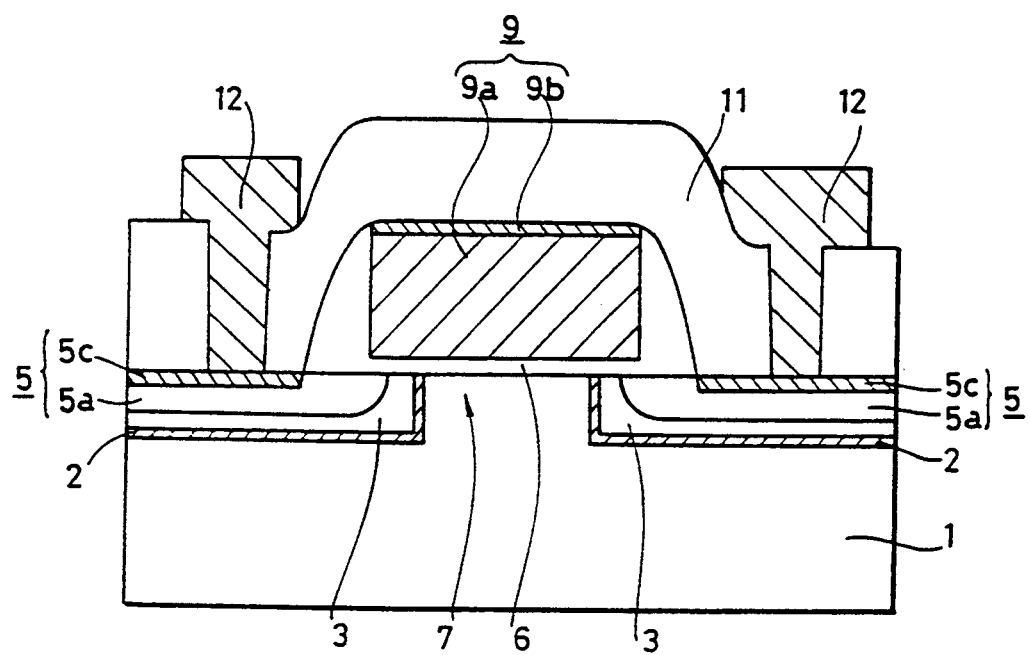
FIG. 27 is a cross sectional view illustrating a cross sectional structure of a field effect transistor according to a fourth embodiment of the present invention.
Figure 28:
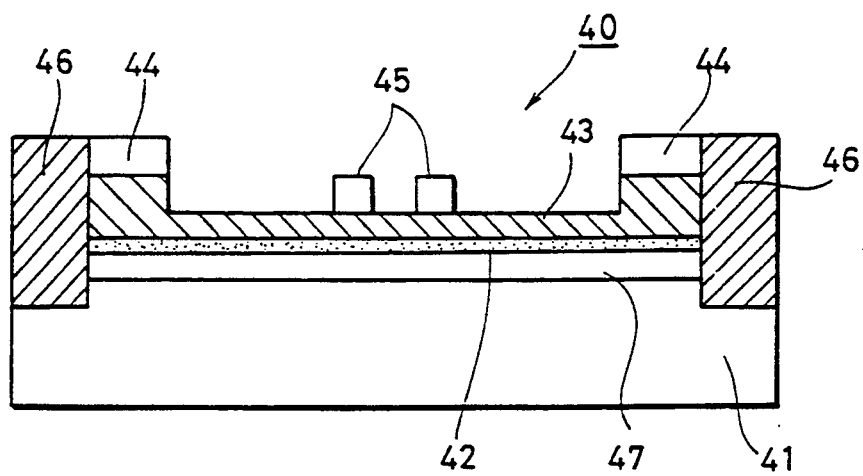
FIG. 28 is a cross sectional view illustrating a cross sectional structure of a first example of a conventional field effect transistor.
Figure 29:
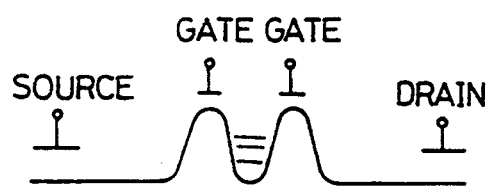
FIG. 29 is a diagram illustrating a potential of a conduction band of the field effect transistor illustrated in FIG. 28.

Now, a fourth embodiment of the present invention will be described. In the embodiment illustrated in FIG. 27, amorphous silicon layer 2 is formed of independent two layers each having a vertical region in channel region 7 extending into the substrate so as to prevent movement of majority carriers and a bottom surface extending parallel with the surface of the substrate along the lower surface of source/drain region 5. It is also possible to form two potential barriers in channel region 7 by such amorphous silicon layers 2, 2.

As described above, it is possible to obtain a current-voltage characteristic using the resonant-tunneling effect by any of the field effect transistors illustrated in the above first to fourth embodiments.

While a wafer directly joining process in which two silicon substrates are directly joined to an amorphous layer to produce solid phase growth has been described as a method of forming a thin amorphous silicon layer in the above embodiments, a method in which no amorphous silicon layer is formed in advance, and silicon substrates are joined directly may be used. In this case, a thin amorphous silicon layer is formed in the boundary of both substrates.

While amorphous silicon is used as a material for forming a potential barrier in the above embodiments, another material, i.e. a material having approximately the same lattice constant as that of silicon and a large bandgap, for example, GaP, AlP, ZnS, $CaF_2$, $SiO_2$, SiC, CdSe or the like may be used.

The potential barrier formed using an amorphous silicon layer described in the above embodiment also serves as a barrier for preventing punch through or thermal diffusion of impurities. In addition, by forming the amorphous layer in a shallow region, it also functions effectively as a barrier for preventing tunneling between bands or as a profile for generating two-dimensional electron gas.

As described above, according to a semiconductor device of the present invention, it is possible to implement a semiconductor device having a larger tunneling effect than that of a conventional semiconductor device using a compound semiconductor or a plurality of gate electrodes by using a material having a bandgap larger than that of silicon for a channel region and utilizing the resonant-tunneling effect. Furthermore, by utilizing a manufacturing method using a wafer directly joining method, it is possible to implement the above-described semiconductor device with inexpensive materials and manufacturing apparatuses and by a simple manufacturing method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor, comprising:
   a substrate having a main surface wherein said main surface of said substrate has a concave part and;
   a pair of source/drain regions formed on the main surface of said substrate, spaced a predetermined distance apart from each other on either side of the concave part of said substrate;
   an insulating layer formed on the main surface of said substrate;
   a gate electrode formed on the surface of said insulating layer; wherein a part of said gate electrode is formed inside said concave part through said insulating layer;
   a channel region formed in said substrate along a surface of the substrate between said pair of source/drain regions wherein said channel region is formed along a surface of said concave part; and
   first and second semiconductor layers formed of a material having a bandgap larger than that of silicon in said channel region, spaced a predetermined distance apart from each other and extending to prevent movement of majority carriers moving between said pair of source/drain regions,
   wherein said substrate includes, at least a first monocrystalline silicon layer and a second monocrystalline silicon layer formed on the surface of said first monocrystalline silicon layer through said first and second semiconductor layers, and wherein said concave part extends through said second monocrystalline silicon layer and through at least a portion of said first monocrystalline silicon layer.

2. The field effect transistor according to claim 1, wherein
said first and second semiconductor layers are formed of one material selected from amorphous silicon, gallium phosphide, aluminum phosphide, zinc sulfide, calcium fluoride, silicon oxide, silicon carbide, and cadmium selenide.

3. The field effect transistor according to claim 1, wherein said first monocrystalline silicon layer and said second monocrystalline silicon layer are formed of silicon substrates having crystal orientations different from each other.

4. A field effect transistor, comprising:
a substrate having a main surface;
a pair of source/drain regions formed on the main surface of said substrate, spaced a predetermined distance apart from each other;
an insulating layer formed on the main surface of said substrate;
a gate electrode formed on the surface of said insulating layer;
a channel region formed in said substrate along a surface of the substrate between said pair of source/drain regions; and
a quantum well formed from first and second semiconductor layers, said first and second semiconductor layers formed of a material having a bandgap larger than that of silicon in said channel region, spaced a predetermined distance apart from each other and extending to prevent movement of majority carriers moving between said pair of source/drain regions,
wherein said substrate includes a first monocrystalline silicon layer and a second monocrystalline silicon layer formed on said first monocrystalline silicon layer through said first and second semiconductor layers, and wherein
said second monocrystalline silicon layer, said first semiconductor layer, said first monocrystalline silicon layer, said second semiconductor layer and said second monocrystalline silicon layer are sequentially arranged in said channel region from one of said source/drain regions to the other of said source/drain regions.

5. A field effect transistor, comprising:
a substrate having a main surface;
a pair of source/drain regions formed on the main surface of said substrate, spaced a predetermined distance apart from each other;
an insulating layer formed on the main surface of said substrate;
a gate electrode formed on the surface of said insulating layer;
a channel region formed in said substrate along a surface of the substrate between said pair of source/drain regions; and
a quantum well formed from a semiconductor layer, said semiconductor layer formed of material having a bandgap larger than that of silicon in said channel region, said semiconductor layer having upwardly extending portions spaced a predetermined distance apart from each other and extending to prevent movement of majority carriers moving between said pair of source/drain regions,
wherein said substrate includes a first monocrystalline silicon layer formed on a second monocrystalline silicon layer through said semiconductor layer,
wherein said second monocrystalline silicon layer, a first upwardly extending portion of said semiconductor layer, said first monocrystalline silicon layer, a second upwardly extending portion of said semiconductor layer and said second monocrystalline silicon layer are sequentially arranged in said channel region from one of said source/drain regions to the other of said source/drain regions, and
wherein said second monocrystalline silicon layer includes said pair of source/drain regions and a concave part between said pair of source/drain regions, and
wherein said first monocrystalline silicon layer is buried inside said concave part of said first monocrystalline silicon layer through said semiconductor layer.

6. The field effect transistor according to claim 4, wherein
said first monocrystalline silicon layer has a convex part in said channel region,
said second monocrystalline silicon layer is formed on both sides of said convex part of said first monocrystalline silicon layer through said first semiconductor layer and second semiconductor layer, and
said pair of source/drain regions are formed on the surface of said second monocrystalline silicon layer.

7. The field effect transistor according to claim 4, wherein
said first and second semiconductor layers are formed of one material selected from amorphous silicon, gallium phosphide, aluminum phosphide, zinc sulfide, calcium fluoride, silicon oxide, silicon carbide, and cadmium selenide.

* * * * *